US006646261B2

United States Patent
Krans

(10) Patent No.: US 6,646,261 B2
(45) Date of Patent: Nov. 11, 2003

(54) SEM PROVIDED WITH A SECONDARY ELECTRON DETECTOR HAVING A CENTRAL ELECTRODE

(76) Inventor: Jan Martijn Krans, Prof. Holstlaan 6, 5656 AA Eindhoven (NL)

( * ) Notice: Subject to any disclaimer, the term of this patent is extended or adjusted under 35 U.S.C. 154(b) by 46 days.

(21) Appl. No.: 10/024,777

(22) Filed: Dec. 20, 2001

(65) Prior Publication Data

US 2002/0125428 A1 Sep. 12, 2002

(30) Foreign Application Priority Data

Dec. 22, 2000 (EP) .......................................... 00204812

(51) Int. Cl.$^7$ .............................................. H01J 37/28
(52) U.S. Cl. ................... 250/310; 250/306; 250/307; 250/308; 250/309; 250/310; 250/396 R; 250/396; 250/397; 250/398
(58) Field of Search .................... 250/397, 306–310, 250/396 R–398

(56) References Cited

U.S. PATENT DOCUMENTS 5,412,209 A * 5/1995 Otaka et al. ................ 250/310
5,789,748 A * 8/1998 Liu et al. .................... 250/310
5,981,947 A * 11/1999 Nakasuji et al. ............ 250/310

OTHER PUBLICATIONS

Ludwig Reimer, "Scanning Electron Microscopy", Physics Of Image Fromation And Microanalysis, Springer–Verlag.
H.O. Funsten, "Response Of 100% Internal Quantum Efficiency Silicon Photodiodes To 200 eV–40 keV Electrons", IEEE Transactions On Nuclear Science, vol. 44, No. 6. Dec. 1997.

* cited by examiner

Primary Examiner—Bruce Anderson
Assistant Examiner—Zia R. Hashmi

(57) ABSTRACT

The invention relates to wafer inspection by means of a scanning electron microscope (SEM) column in which the secondary electron detector 22, 24 is positioned centrally above the objective lens of the column. Secondary electrons that leave the central part of the specimen in a direction substantially perpendicular to its surface are inevitably collected in the central part of the detector surface where the bore 36 for the primary beam 6 is situated. Consequently, such electrons do not contribute to the detector signal. In order to avoid such a detrimental loss of signal contribution, it is proposed to provide a central electrode 35 in the central bore 36 such that secondary electrons that approach the bore are driven aside towards the electron-sensitive detector region 48.

20 Claims, 4 Drawing Sheets

SEM PROVIDED WITH A SECONDARY ELECTRON DETECTOR HAVING A CENTRAL ELECTRODE

The invention relates to a particle-optical apparatus which includes

- a particle source for producing a primary beam of electrically charged particles that travel along an optical axis of the apparatus,
- a specimen carrier for a specimen to be irradiated by means of the apparatus,
- a focusing device for forming a focus of the primary beam in the vicinity of the specimen carrier by means of electrostatic electrodes, and
- a detector that has a detector surface for detecting electrically charged particles that emanate from the specimen in response to the incidence of the primary beam, which detector is arranged ahead of the focusing device, viewed in the propagation direction of the primary beam, and which detector surface is provided with a central bore for the passage of the primary beam.

An apparatus of this kind is known from the published international patent application WO 99/34397. In the apparatus described therein a region of a specimen to be examined is scanned by means of a primary focused beam of electrically charged particles, usually electrons, that travel along an optical axis of the apparatus. An apparatus of this kind is known as a Scanning Electron Microscope (SEM).

Irradiation of the specimen to be examined releases electrically charged particles, such as secondary electrons, from the specimen; such particles have an energy which is significantly lower than that of the particles in the primary beam, for example, of the order of magnitude of from 1 to 5 eV. The energy and/or the energy distribution of such secondary electrons offers information as regards the nature and composition of the specimen. Therefore, a SEM is advantageously provided with a detection device (detector) for secondary electrons. Such electrons are released at the side of the specimen where the primary beam is incident, after which they travel back against the direction of incidence of the primary electrons. When a detector (for example, a detector provided with an electrode carrying a positive voltage) is arranged in the path of the secondary electrons thus traveling back, the secondary electrons will be captured by this electrode and the detector will output an electrical signal that is proportional to the electrical current thus detected. The (secondary electron) image of the specimen is thus formed in known manner. The detector in the known particle-optical apparatus is formed by a detector crystal of cerium-doped yttrium aluminum garnet (YAG) that produces a light pulse in response to the capture of an electron of adequate energy; this light pulse is converted into an electrical signal wherefrom an image of the specimen can be derived. The detector crystal is provided with a bore for the passage of the primary beam. The surface that faces the secondary electrons is the detector surface for the detection of electrically charged particles that emanate from the specimen in response to the incidence of the primary beam.

Nowadays there is a tendency to construct SEMs to be as small as possible. Apart from economical motives (generally speaking, smaller apparatus can be more economically manufactured), such small apparatus offer the advantage that, because of their mobility and small space required, they can be used not only as a laboratory instrument but also as a tool for the formation of small structures, for example, as in the production of integrated circuits. In this field a miniaturized SEM can be used for direct production as well as for inspection of products. With a view to direct production, the SEM can be used to write, using electrons, a pattern on the IC to be manufactured. With a view to the application for inspection, the SEM can be used to observe the relevant process during the writing by means of a further particle beam (for example, an ion beam for implantation in the IC to be manufactured); it is also possible to use the SEM for on-line inspection of an IC after completion of a step of the manufacturing process.

For miniaturization of a SEM it is attractive to use an electrostatic objective, because such an objective can be constructed so as to be smaller than a magnetic lens. This is due to the absence of the need for cooling means (notably cooling ducts for the lens coil) and due to the fact that the magnetic (iron) circuit of the lens must have a given minimum volume in order to prevent magnetic saturation. Moreover, because of the requirements that are imposed nowadays in respect of high vacuum in the specimen space, electrostatic electrodes (being constructed as smooth metal surfaces) are more attractive than the surfaces of a magnetic lens that are often provided with coils, wires and/or vacuum rings. Finally, as is generally known in particle optics, an electrical field is a more suitable lens for heavy particles (ions) than a magnetic field. The objective in the known SEM has two electrostatic electrodes which together constitute a decelerating system for the primary beam.

The arrangement of the detector for the secondary electrons in a position ahead of the focusing device in the known SEM offers the advantage that, when the SEM is used for the inspection of ICs, it is also easier to look into pit-shaped irregularities; this is because observation takes place along the same line as that along which the primary beam is incident. Moreover, arranging a detector to the side of the objective and directly above the specimen would have the drawback that the detector would then make it impossible to make the distance between the objective and the specimen as small as desirable with a view to the strong reduction of electron source that is necessary so as to achieve a size of the scanning electron spot that is sufficiently small so as to realize the required resolution. Furthermore, when an electrostatic objective is used in a SEM, it often happens that the electrostatic lens field of the objective extends beyond the physical boundaries of the object, so possibly as far as the specimen. (This electrical field between the final electrode of the objective and the specimen is also referred to as the leakage field. Because of the presence of the leakage field, secondary electrons that emanate from the specimen would be attracted by this field. A detector that is arranged, for example, to the side of the objective would then require a much stronger attractive effect whereby the primary beam would be influenced to an inadmissible extent. This adverse effect is avoided by arranging the detector above the objective. When the secondary electrons attracted by the leakage field have passed through the bore of the objective, they are accelerated, by the electrical field present therein, to an energy value that corresponds to the potential in the space ahead of the objective. The electrons thus accelerated now have an energy that suffices so as to excite the detector material, thus enabling detection.

The secondary electrons to be detected are incident in different points of incidence on the detector surface, that is, in dependence on the location on the specimen wherefrom they originate, on their initial energy and on the angle at which they leave the specimen. The paths of such electrons are influenced by the accelerating field that is present within the objective electrodes and by the deflection fields that are required for the scanning of the primary beam, since the secondary electron beam also passes through these deflection fields so that it is not clear a priori where the electrons that emanate from a given point on the specimen will land. However, it will practically always be the case that the electrons that emanate from one point with the same energy and that leave the specimen also at the same angle will be incident in approximately the same point on the detector surface, whereas electrons that originate from the same point and at the same angle but with a different energy will be incident in a different point on the detector surface. This is of importance notably for electrons that originate from a pit-like recess in the specimen surface as is frequently the case in integrated circuits. Such electrons will leave the specimen surface approximately at right angles. When the pit-like recess is to be inspected, it will be situated at the point of intersection of the optical axis and the specimen surface or in the direct vicinity of this point. Even though the point of incidence on the detector surface is not known a priori for many secondary electrons, it is a fact that said secondary electrons that emanate from the pit-like recess will land at the center of the detector surface, that is, at the area of the point of intersection and the detector surface. The central bore for the passage of the primary beam is situated exactly at that area, so that the major part of these secondary electrons of importance disappears through the detector bore and hence does not contribute to the detector signal.

It is an object of the invention to provide a particle-optical apparatus of the kind set forth in which the collection efficiency, that is, the fraction of the total number of emitted secondary electrons that ultimately contributes to the detected signal is significantly improved for the described situation. To this end, the particle-optical apparatus in accordance with the invention is characterized in that the detector is provided with a central electrode at the area of the central bore, and that the particle-optical apparatus is provided with power supply means for adjusting such a voltage across the central electrode that at the area of the detector surface the central electrode exerts a repulsive force on the particles that emanate from the specimen. As a result of these steps it is achieved that the particles that emanate from the specimen and would pass through the detector bore are driven away from the bore by the electrical field of the central electrode so that they are incident on the detector surface and hence contribute to the signal to be detected.

For the examination of a specimen it is often desirable that voltage contrast can be observed, meaning that regions of the specimen that have a mutually different potential (for example, of the order of magnitude of some volts) exhibit a different intensity in the image, so that contrast arises between such regions in the image. This is desirable especially for the inspection of integrated circuits in which the presence of defects becomes manifest as the presence or absence of voltage differences in the circuit. A difference in intensity will thus arise between different voltage regions.

The central electrode in a preferred embodiment of the apparatus in accordance with the invention is constructed so as to be rotationally symmetrical around the optical axis. In many cases the detector surface will have a rotationally symmetrical shape around the optical axis. A rotationally symmetrical shape around the optical axis of the central electrode is very well compatible with this shape of the detector surface and hence does not produce electrical fields that disturb said rotational symmetry and hence influence the paths of the secondary electrons in a manner that is difficult to predict.

The detector in a further preferred embodiment of the apparatus in accordance with the invention is constructed as a semiconductor detector. Semiconductor detectors are particularly attractive for the further miniaturization of the particle-optical column as is desirable when the column is used for wafer inspection in the manufacture of semiconductors. When a plurality of columns is employed in a dense arrangement, the use of the known scintillation crystal detector necessitates the presence of many light conductors for the transfer of the optical signals to an optoelectronic converter, and of glass members for the transfer of the light from the scintillator crystals to the light conductors. This is objectionable in a situation where thorough miniaturization is pursued, so that the use of a detector that directly supplies electrical signals (such as the semiconductor detector) is to be preferred in such cases. The (ring-shaped) detector surface of a semiconductor detector is provided with a ring-shaped p-doped region that is sensitive to secondary electrons. In order to impart the desired homogeneity to the electrical field inside the semiconductor body, the detector surface must be provided with field-forming rings (guard rings) that are situated to the sides of the ring-shaped p-doped region, that is, a first ring directly around the optical axis and a second ring around the periphery of the ring-shaped p-doped region. The space that is occupied by the first guard ring is not available for collection of the secondary electrons that are incident at that area, so that the collection efficiency would thus be degraded. It is an additional advantage of the invention that the presence of the central electrode also offers a solution to this problem.

The voltage of the power supply means in a further embodiment of the apparatus in accordance with the invention can be adjusted by the user of the apparatus. The user can thus optimize the detection of the secondary electrons in dependence on the type of specimen and on the adjusted operating conditions of the apparatus.

The invention will be described in detail hereinafter with reference to the Figures in which corresponding reference numerals denote corresponding elements. Therein:

Figure 1:
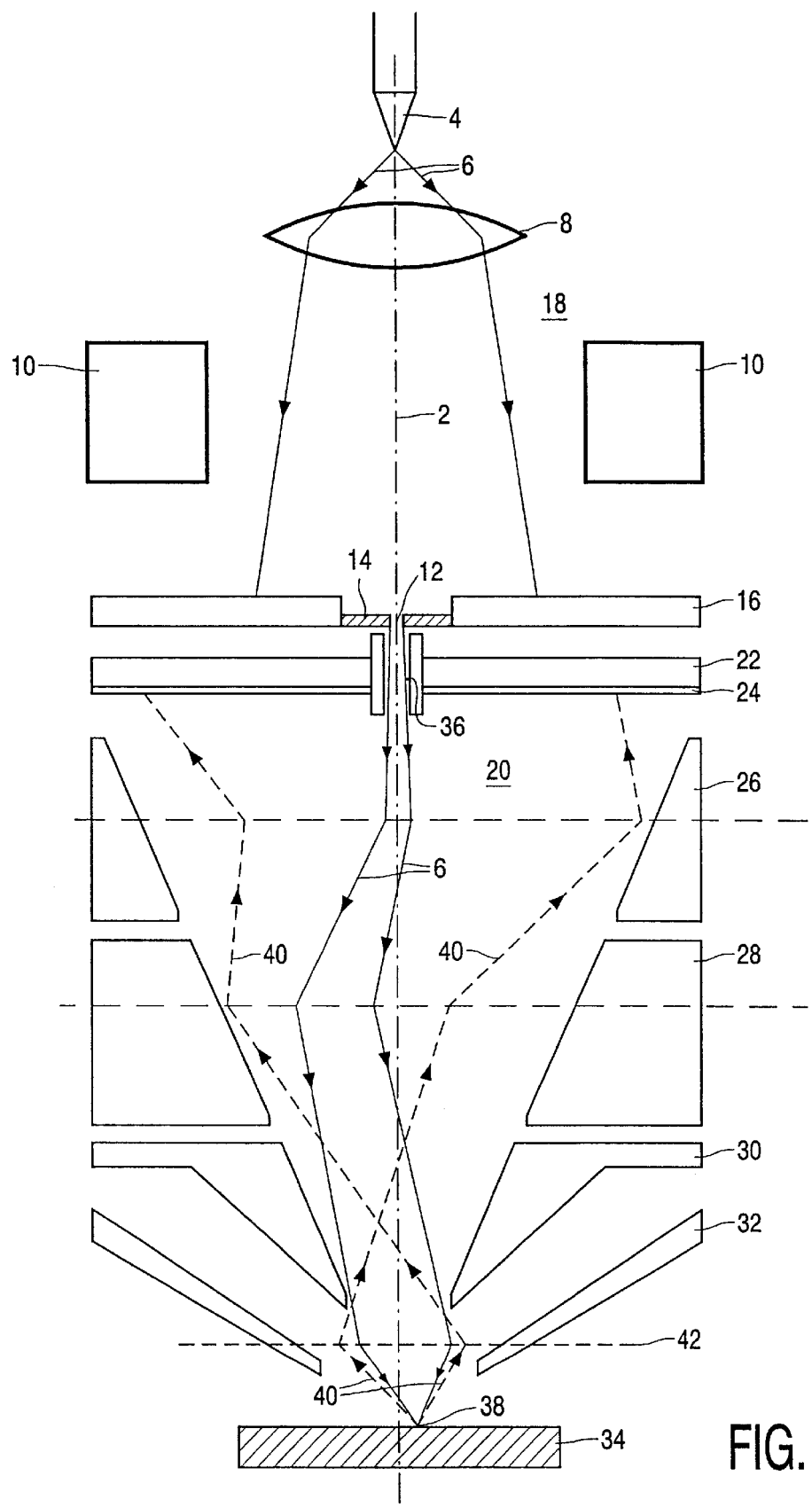
FIG. 1 is a diagrammatic representation of an electron optical column in accordance with the invention, together with a first set of electron paths.

FIG. 1 is a diagrammatic representation of an electron optical column that is suitable for use in accordance with the invention. This Figure shows in general the path of the primary electron beam and that of the beam of secondary electrons. The column that is shown in this Figure has an optical axis 2 on which there is arranged a particle source in the form of an electron source 4 of the field emission type (field emission gun or FEG) that is arranged to produce a primary electron beam 6. As is known, it is important that such a particle source is arranged in a high quality vacuum, for example with a pressure of the order of magnitude of $10^{-8}$ N/m$^2$. After leaving the source 4, the primary beam 6 passes a condenser lens 8 that is capable of controlling the degree of convergence or divergence of the primary beam 6.

The condenser lens 8 is succeeded by a deflection unit 10 which can be used inter alia for directing the beam 6 towards the opening 12 of the diaphragm 14 that is arranged in a diaphragm holder 16.

The angle of aperture of the primary beam 6 is limited by the diaphragm 14; subsequent to this diaphragm the beam continues its travel in the column space 20. Viewed from the top downwards, the column space accommodates successively a detector crystal 22, an electrostatic acceleration electrode 24, a first electrical scanning electrode 26, a second electrical scanning electrode 28, a first electrostatic electrode 30 that forms part of the objective, and a second electrostatic electrode 32 that also forms part of the objective. Finally, the electrons of the primary beam 6 reach the specimen 34.

The detector crystal 22 forms part of the detector for the detection of secondary electrons that emanate from the specimen in response to the incidence of the primary beam. The detector crystal in this Figure consists of a substance (for example, cerium-doped yttrium aluminum garnet or YAG) that produces a light pulse in response to the capture of an electron of adequate energy; this light pulse is conducted further by means of optical guide means (not shown) and is converted, in an optoelectric converter, into an electrical signal wherefrom an image of the specimen can be derived, if desired. The latter elements also form part of said detector. The detector crystal 22 is provided with a bore 36 for the passage of the primary beam, and in said bore there is provided a central electrode 35 that is insulated from the acceleration electrode 24. The central electrode 35 can be adjusted to a desired voltage of, for example, 5 kV by means of a variable power supply unit that is not shown.

The electrostatic acceleration electrode 24 is shaped as a flat plate that is provided with a bore for the primary beam and is deposited on the detection material, notably on the detection surface of the scintillation crystal 22, in the form of a conductive oxide, for example indium oxide and/or tin oxide. The electrode 24 can be adjusted to a desired voltage of, for example 9 kV by means of a power supply unit that is not shown.

The first electrical scanning electrode 26 and the second electrical scanning electrode 28 form part of a beam deflection system for controlling the scanning motion of the primary beam across the specimen 34. Each of these two electrodes is constructed as a tubular portion that has an external shape in the form of a straight circular cylinder and an internal shape in the form of a cone that is tapered in the direction of the beam. Each of the electrodes 26 and 28 is subdivided into four equal parts by way of two saw cuts in mutually perpendicular planes through the optical axis, so that each of the electrodes 26 and 28 is capable of producing electrical dipole fields in the x direction as well as in the y direction by application of suitable voltage differences between the parts, with the result that the primary beam can scan across the specimen 34 and the path of the secondary electrons that move in the direction of the detector crystal can be influenced. Instead of subdividing the electrodes 26 and 28 into four parts, they can also be subdivided into a larger number of parts, for example, eight equal parts, by means of four saw cuts in a plane through the optical axis. When the appropriate voltages are applied to the various parts of each of the electrodes, the system thus formed can be used not only for deflecting the beam but also as a stigmator.

The first electrode 30 and the second electrode 32 constitute the electrode system which forms the objective of the column. Internally as well as externally the electrode 30 is shaped as a cone which is tapered downwards, so that this electrode fits within the electrode 32. Internally as well as externally the electrode 32 is also shaped as a cone that is tapered downwards; the external conical shape offers optimum space for the treatment of comparatively large specimens such as the circular wafers that are used for the manufacture of ICs and that may reach a diameter of 300 mm. Because of the external conical shape of the electrode 32, the primary beam can be made to strike the wafer at a comparatively large angle by tilting the wafer underneath the objective, without the wafer experiencing interference from parts that project from the objective. A dashed line 42 in the Figure indicates the region in which the lens effect of the electrical objective field (so the paraxial center of the objective) can be assumed to be localized.

The objective 30, 32 focuses the primary beam 6 in such a manner that the electron source is imaged on the specimen with a generally very large reduction; because of this strong reduction, the distance between the surface of the specimen 34 and the center of the lens 36 (the focal distance) is very small which, as has already been mentioned, would severely limit the possibility of tilting if the external shape of the electrode 32 were not conical.

The incidence of the primary electron beam 6 on the surface of the specimen 34 releases secondary electrons therefrom in the vicinity of the point of incidence 38. Because the voltage difference that exists between the objective electrodes 30 and 32 also causes an electrical field (referred to as the leakage field) in the space between the lower electrode 32 and the specimen 34, said secondary electrons move in the direction of the objective 32, 34 under the influence of the leakage field. The secondary electrons thus form a secondary electron beam 40 whose direction of propagation opposes that of the primary beam 6. The electrical field that is present between the objective electrodes 30 and 32 accelerates the secondary electrons to a speed that corresponds to the voltage between the objective electrodes that amounts to, for example, 10 kV. The secondary beam is also sensitive to deflection by the scanning electrodes 26 and 28, but practically the entire secondary beam 40 will reach the detector crystal 22 as a result of the tapered shape of the interior of these electrodes.

Figure 2:
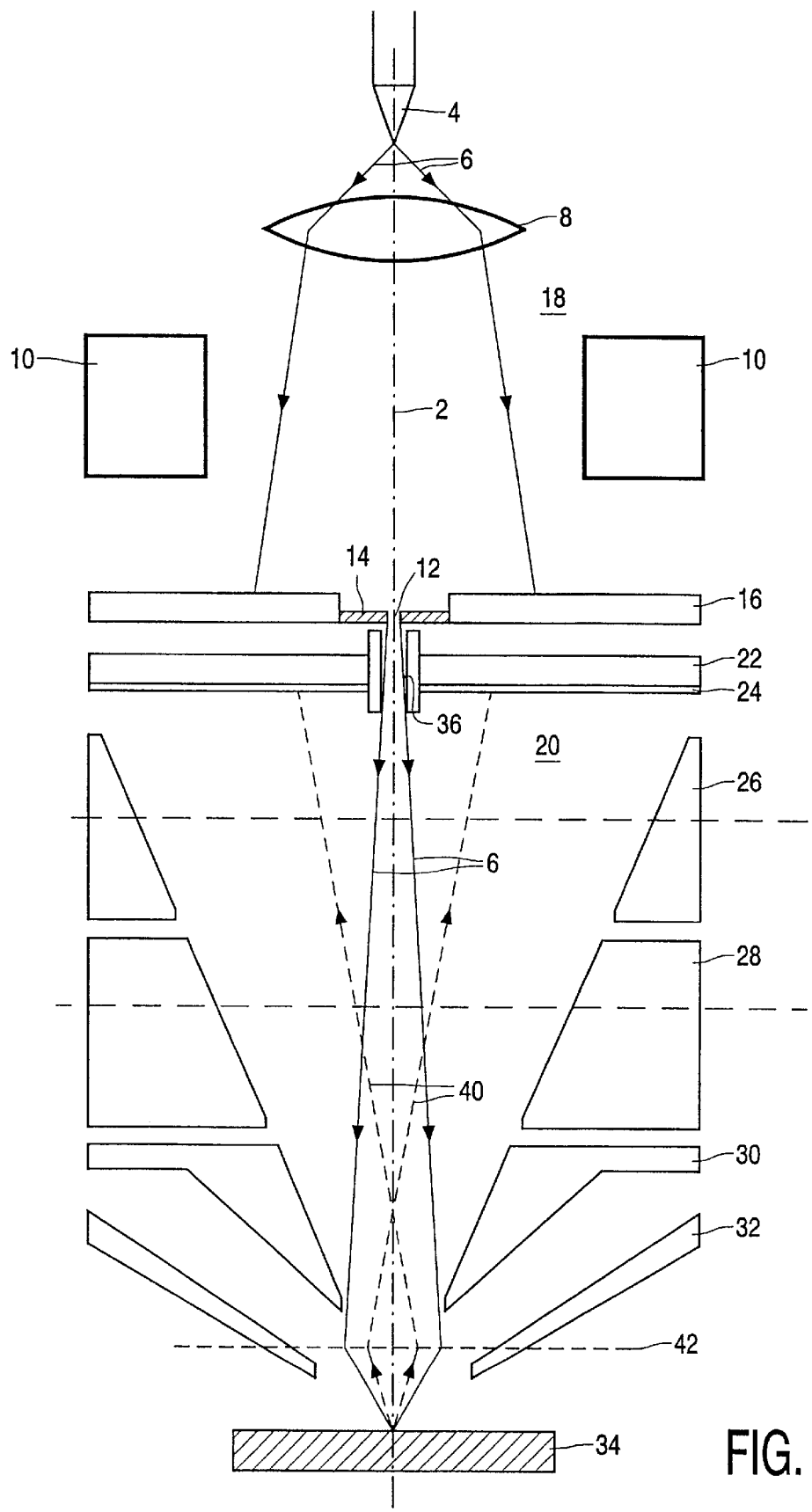
FIG. 2 is a diagrammatic representation of an electron optical column in accordance with the invention, together with a second set of electron paths.

FIG. 2 is a diagrammatic representation of the electron optical column that is shown in FIG. 1, be it with different electron paths. For this Figure it is assumed that the deflection fields that are generated by the scanning electrodes 26 and 28 have a negligibly small effect on the direction of the beam, and hence on the point of incidence. This assumption is justified because the scanning distance of the primary beam on the specimen will not be more than approximately 100 $\mu$m; the deflection fields that are required for this purpose have a value such that the deflection of the beam of secondary electrons on the detector surface is of the same order of magnitude. This deflection can be ignored considering the dimensions of the detector surface. This Figure shows the situation where the primary beam strikes the specimen surface at the point of intersection 38 of the specimen surface and the optical axis 2, that is, in a pit-like recess (not shown). In this case the beam of secondary electrons 40 leaves the specimen surface at the point 38 on the axis, that is, more or less perpendicularly to said surface. Because the secondary electrons that are released at the bottom of the pit-like recess leave the specimen surface approximately at right angles, such secondary electrons will strike the detector surface at the area of the central bore 36 as can be understood on the basis of the rotational symmetry of the column. This assumption is justified because the magnitude of the scanning motion of the beam is many times smaller than the magnitude of the central bore 36.

Figure 3:
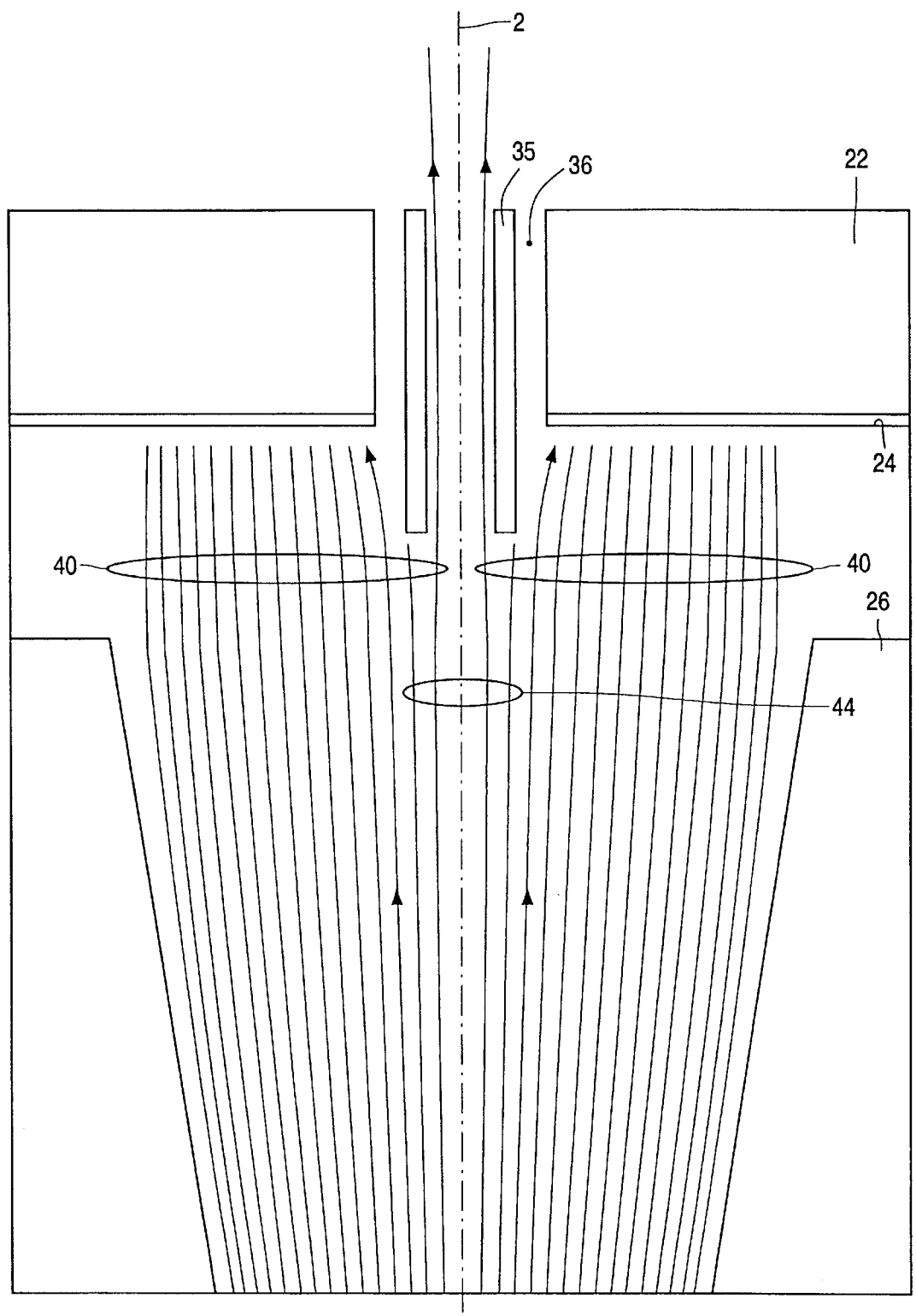
FIG. 3 is a more detailed representation of the secondary electron paths in the vicinity of the central detector electrode.

FIG. 3 is a more detailed representation of the secondary electron paths in the vicinity of the central detector electrode. For the sake of clarity this Figure does not show the primary beam 6, but exclusively the beam of secondary electrons 40. Like in FIG. 2 it is assumed that the deflection fields that are generated by the scanning electrodes 26 and 28 have a negligibly small effect on the direction of the beam, and hence on the position of incidence. The Figure has been obtained by way of a computer simulation where a voltage of 8 kV is assumed to be present on the acceleration electrode 24 and a voltage of 5 kV on the central electrode 35. An initial energy of 5 eV is assumed for the beam of secondary electrons 40; this beam extends from the bottom upwards, the initially diverging outer electron paths clearly being pulled in the direction of the electrode 24 in the vicinity of this electrode. Because of their central position, the electron paths 44 that are situated nearest to the center do not experience a force towards the outside and hence do not contribute to the detector signal. The electron paths 44 that are situated further outwards from the central part of the beam 40, however, experience an outwards directed force and hence are pushed away from the bore 36 so that they contribute to the detector signal.

Figure 4:
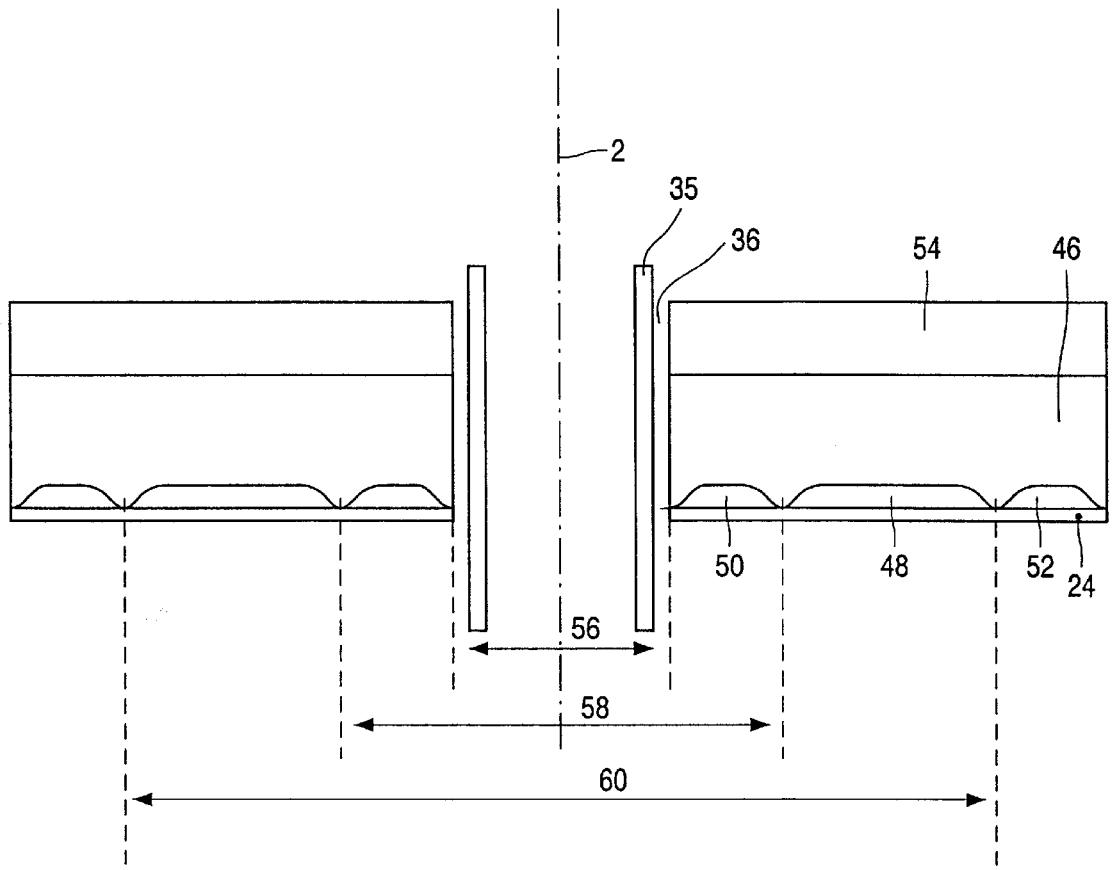
FIG. 4 is a cross-sectional view of a semiconductor detector for use in an electron optical column in accordance with the invention.

FIG. 4 is a cross-sectional view of a semiconductor detector for use in an electron optical column in accordance with the invention. Semiconductor detectors of this kind are known per se, for example, from an article in IEEE Transactions on Nuclear Science, Vol. 44, No. 6, December 1997, pp. 2561 to 2665: "Response of 100% Internal Quantum Efficiency Silicon Photodiodes to 200 eV–40 keV Electrons", or from the book "Scanning Electron Microscopy", chapter 5.2: "Current Measurement and Semiconductor Detector" pp. 185 to 190 (ISBN 0-387-13530-8). The detector that is shown in FIG. 4 is arranged so as to be rotationally symmetrical around the optical axis 2 and is provided with a central bore 36 in which the central electrode 35 is provided so as to be insulated from the remaining parts of the detector. The detector is formed by a semiconductor body 46 of n⁻ material in which there is provided a p-doped region 48. An inner guard ring 50 and an outer guard ring 52 are provided so as to impart the desired shape to the electrical field within the region 46. The acceleration electrode 24 is provided on the p-doped region 48 and the guard rings 50 and 52. On the other side of the body 46 there is provided an n⁺-doped region 54. The region 48 is the region that is sensitive to the secondary electrons, whereas the other parts of the detector surface are not sensitive to such secondary electrons.

In a typical semiconductor detector for use in a SEM column as shown in FIG. 1 or FIG. 2 the body 46 has a diameter of approximately 6 mm. The diameter 56 of the central bore 36 then amounts to approximately 1 mm whereas the outer diameter 58 of the inner guard ring 50 amounts to approximately 2 mm and the outer diameter 60 of the p-doped region 48 amounts to approximately 6 mm. Because the dimensions of the guard rings are determined by the effect that these rings are expected to exert on the electrical field, the diameter of these rings cannot be made arbitrarily small, so that notably the inner guard ring 50 imposes a lower limit as regards the magnitude of the surface that does not contribute to the detector signal. The values stated reveal that approximately 11% of the surface that can be reached by the secondary electron beam does not contribute to the detector signal; this relative share becomes even larger as the miniaturization of the inspection column progresses, because the guard ring 50 cannot be reduced to the same extent. The invention offers a solution to this problem in that the beam of secondary electrons is now concentrated in the region 48.

What is claimed is:

1. A particle-optical apparatus which includes
   a particle source for producing a primary beam of electrically charged particles that travel along an optical axis of the apparatus,
   a specimen carrier for a specimen to be irradiated by means of the apparatus,
   a focusing device for forming a focus of the primary beam in the vicinity of the specimen carrier by means of electrostatic electrodes, and
   a detector that has a detector surface for detecting electrically charged particles that emanate from the specimen in response to the incidence of the primary beam, which detector is arranged ahead of the focusing device, viewed in the propagation direction of the primary beam, and which detector surface is provided with a central bore for the passage of the primary beam,
   characterized in that
   the detector is provided with a central electrode at the area of the central bore and
   that the particle-optical apparatus is provided with a power supply for adjusting such a voltage across the central electrode that at the area of the detector surface the central electrode exerts a repulsive force on the particles that emanate from the specimen.

2. A particle-optical apparatus as claimed in claim 1, wherein the central electrode is rotationally symmetrical around the optical axis.

3. A particle-optical apparatus as claimed in claim 1, wherein the detector is constructed as a semiconductor detector.

4. A particle-optical apparatus as claimed in claim 3, wherein the voltage of the power supply can be by the user of the apparatus.

5. A particle-optical apparatus as claimed in claim 1 in which the repulsive force includes a component normal to the optical axis, thereby accelerating the charged particles away from the central bore so that some of the charged particles miss the central bore and strike the detector surface.

6. A particle-optical apparatus as claimed in claim 1 in which the voltage applied to the central electrode produces a repulsive force directed radially away from the optical axis.

7. A particle-optical apparatus as claimed in claim 1 in which the detector surface defines a detector plane and in which the detector plane intersects at least a potion of the central electrode.

8. A particle-optical apparatus, comprising:
   a particle source for producing a primary beam of electrically charged primary particles that travel along an optical axis of the apparatus.
   a detector for detecting electrically charged secondary particles that emanate from the specimen in response to the incidence of the primary beam, the detector having a detector surface and a central bore for the passage of the primary beam; and
   an electrode for generating an electric field to deflect the secondary particles away from the center bore and toward the detector surface.

9. The particle-optical apparatus of claim 8 in which the detector is positioned ahead of the focusing device, viewed in the propagation direction of the primary beam.

10. The particle-optical apparatus of claim 8 in which the electrode is positioned such that a plane than includes the detector surface intersects the electrode.

11. The particle-optical apparatus of claim 10 in which the electrode comprises a tube centered on the optical axis.

12. The particle-optical apparatus of claim 8 in which the electrode is maintained at a voltage relative to the detector to deflect secondary particles away from the center bore.

13. The particle-optical apparatus of claim 8 in which the detector comprises a semiconductor detector.

14. The particle-optical apparatus of claim 8 in which the electrode is rotationally symmetrical around the optical axis.

15. The particle-optical apparatus of claim 8 in which the voltage on the electrode can be adjusted by the user of the apparatus.

16. The particle-optical apparatus of claim 8 in which:
the electrode is positioned such that a plane than includes the detector surface intersects the electrode; and
the electrode is maintained at a voltage relative to produce an electric field to deflect secondary particles away from the center bore, the electric field having a component normal to the primary beam axis.

17. A method of detecting secondary particles in a charged particle beam system having an optical axis, the method comprising:
generating secondary particles by impinging a primary particle beam onto a sample;
accelerating the secondary particles away from the sample toward a detector having a detector surface and having a space through which the primary particle beam passes; and
deflecting the secondary charged particles away from the space and toward the detector surface.

18. The method of claim 17 in which deflecting the secondary charged particles away from the space and toward the detector surface includes providing an electric field having a radial component away emanating from a central electrode concentric with the optical axis.

19. The method of claim 17 in which the providing a radial electric field away emanating front a central electrode concentric with the primary beam axis includes providing a central electrode positioned so as to be intersected by a plane defined by the detector surface.

20. The method of claim 17 in which deflecting the secondary charged particles away from the hole and toward the detector surface includes adjusting a potential difference between the electrode and the detector.

* * * * *